United States Patent
Hulsebos et al.

(10) Patent No.: US 12,032,305 B2
(45) Date of Patent: Jul. 9, 2024

(54) ALIGNMENT METHOD AND ASSOCIATED ALIGNMENT AND LITHOGRAPHIC APPARATUSES

(71) Applicant: ASML NETHERLANDS B.V., Veldhoven (NL)

(72) Inventors: Edo Maria Hulsebos, Bergeijk (NL); Franciscus Godefridus Casper Bijnen, Valkenswaard (NL)

(73) Assignee: ASML NETHERLANDS B.V., Veldhoven (NL)

( * ) Notice: Subject to any disclaimer, the term of this patent is extended or adjusted under 35 U.S.C. 154(b) by 78 days.

(21) Appl. No.: 17/922,593

(22) PCT Filed: May 11, 2021

(86) PCT No.: PCT/EP2021/062483
§ 371 (c)(1),
(2) Date: Oct. 31, 2022

(87) PCT Pub. No.: WO2021/239461
PCT Pub. Date: Dec. 2, 2021

(65) Prior Publication Data
US 2023/0168595 A1    Jun. 1, 2023

(30) Foreign Application Priority Data
May 27, 2020  (EP) .................................... 20176845

(51) Int. Cl.
G03F 7/20   (2006.01)
G03F 9/00   (2006.01)
G03F 7/00   (2006.01)

(52) U.S. Cl.
CPC .......... *G03F 9/7092* (2013.01); *G03F 9/7076* (2013.01); *G03F 7/70625* (2013.01)

(58) Field of Classification Search
CPC ... G03F 9/7092; G03F 9/7076; G03F 7/70625
See application file for complete search history.

(56) References Cited

U.S. PATENT DOCUMENTS 10,416,577 B2 * 9/2019 Brinkhof ............... G03F 9/7046
2009/0195768 A1 * 8/2009 Bijnen ................... G03B 27/32
355/77

* cited by examiner

Primary Examiner — Mesfin T Asfaw
(74) Attorney, Agent, or Firm — Pillsbury Winthrop Shaw Pittman, LLP

(57) ABSTRACT

A method of, and associated apparatuses for, performing a position measurement on an alignment mark including at least a first periodic structure having a direction of periodicity along a first direction. The method includes obtaining signal data relating to the position measurement and fitting the signal data to determine a position value. The fitting uses one of a modulation fit or a background envelope periodic fit.

20 Claims, 6 Drawing Sheets

# ALIGNMENT METHOD AND ASSOCIATED ALIGNMENT AND LITHOGRAPHIC APPARATUSES

CROSS-REFERENCE TO RELATED APPLICATIONS

This application is the U.S. national phase entry of PCT Patent Application No. PCT/EP2021/062483 which was filed on May 11, 2021, which claims priority of European Patent Application No. 20176845.4 which was filed on 27 May 2020 and which is incorporated herein in its entirety by reference.

FIELD OF THE INVENTION

The present invention relates to methods and apparatus usable, for example, in the manufacture of devices by lithographic techniques, and to methods of manufacturing devices using lithographic techniques. The invention relates to metrology devices, and more specifically metrology devices used for measuring position such as alignment sensors and lithography apparatuses having such an alignment sensor.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor or alignment sensor (both terms are used synonymously), typically an optical position sensor.

The lithographic apparatus includes one or more alignment sensors by which positions of marks on a substrate can be measured accurately. Different types of marks and different types of alignment sensors are known from different manufacturers and different products of the same manufacturer. A type of sensor widely used in current lithographic apparatus is based on a self-referencing interferometer as described in U.S. Pat. No. 6,961,116 (den Boef et al). Various enhancements and modifications of the position sensor have been developed, for example as disclosed in US2015261097A1. The contents of all of these publications are incorporated herein by reference.

It is increasingly desirable to reduce the size of alignment marks and the time to measure the alignment marks, as both reticle space and metrology time is at a premium in IC manufacture. Reducing the size of alignment marks reduces the scan length over the mark and results in an increased impact of neighboring structures on the aligned position. The measured position from such small marks, and particularly if measured at a desired speed and orientation to detect two position directions in one scan, suffers from poor reproducibility (repro) and accuracy, due to one or both of the short scan length and neighboring structure impact. It is desirable to improve repro and accuracy in measuring such marks.

SUMMARY OF THE INVENTION

The invention in a first aspect provides a method of performing a position measurement on an alignment mark comprising at least a first periodic structure having a direction of periodicity along a first direction; the method comprising: obtaining signal data relating to the position measurement; and fitting the signal data to determine a position value; wherein the fitting step uses one of: a modulation fit; or a background envelope periodic fit.

The invention in a second aspect provides a method of performing a position measurement on a dual direction alignment mark comprising a first periodic structure arranged with a second periodic structure having a direction of periodicity in a second direction different from said first direction; said mark being configured to be scanned obliquely to the first direction and second direction; the method comprising: obtaining signal data relating to the position measurement, the signal data comprising at least a first direction component relating to a first effective pitch detected during said oblique scan and a second direction component of the signal data related to a second effective pitch detected during said oblique scan direction; and applying a correction for signal disturbance due to vibrations at a difference frequency corresponding to the difference of a first frequency in the signal data relating to the first effective pitch and a second frequency in the signal data relating to the second effective pitch.

The invention in a third aspect provides a method of performing a position measurement on an alignment mark comprising at least a first periodic structure having a direction of periodicity along a first direction; the method comprising: obtaining signal data relating to the position measurement; and creating an oblique projection operator which operates on the signal data and blocks the signal data resulting from crosstalk of neighboring structures which neighbor said alignment mark.

Also disclosed is a computer program, metrology apparatus and a lithographic apparatus being operable to perform the method of any of the above aspects.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
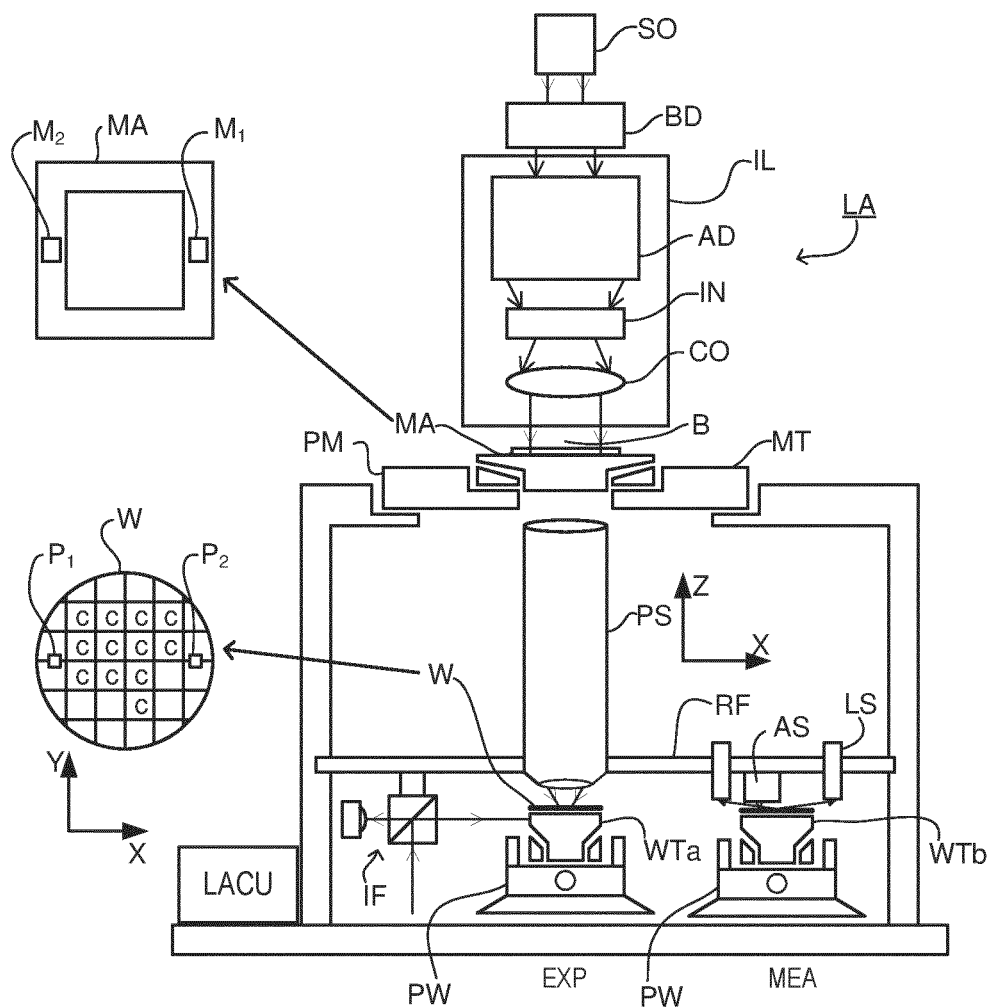
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
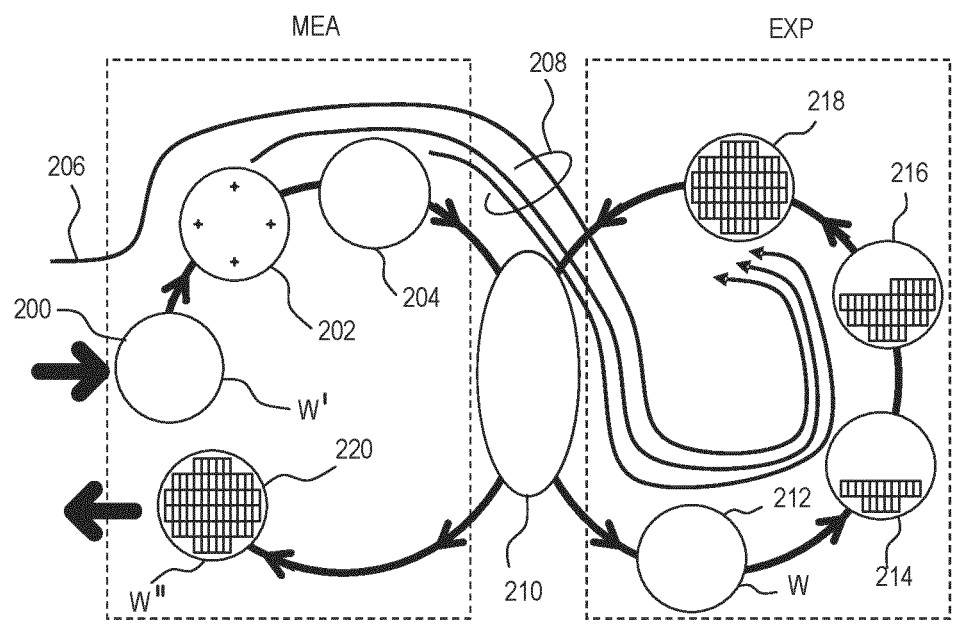
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
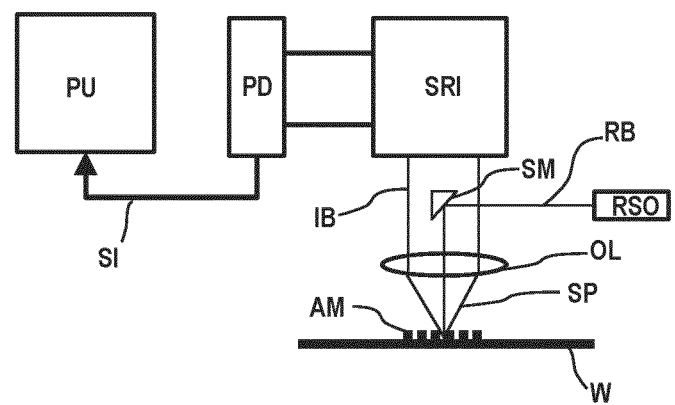
FIG. 3 is a schematic illustration of a first alignment sensor adaptable according to an embodiment.

FIG. 3 is a schematic block diagram of an embodiment of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

In performing alignment by measuring the position of alignment marks on the substrate using an alignment sensor, it would be desirable to reduce the area (footprint) of the alignment marks, so that many of them could be accommodated all over the wafer; including in-die (e.g., between product structures) where wafer space is "expensive". It is therefore desirable, in a scanning-type alignment sensor (e.g., which scans an underfilled spot over the mark to generate a signal for the SRI), to reduce the length of the required scan length over the mark to maintain sufficient accuracy and reproducibility (repro). In addition to a regular periodic alignment mark, which provides a 1D position (X or Y) per scan, there is also the oblique mark which enables detection simultaneously in X and Y directions (e.g., both directions parallel to the substrate plane), thereby decreasing alignment time and increasing throughput. Such an oblique mark may comprise two segments with mark structures under +/−45 degrees angle.

Presently, for spot underfilled marks, a fast Fourier transform (FFT)-based alignment fit (e.g., least squares fit) is used to determine the aligned position from the alignment signal. This is equivalent to performing a least squares fit of sine and cosine signals. The aligned position of the mark is calculated by determining the phase from the fitted sine and cosine signals and combining this with the average stage position during the scan.

With smaller marks, the sensor beam will not be incident fully on the alignment mark and therefore the alignment signal will not be perfectly periodic. The resulting signal is a periodic signal with a varying amplitude (or envelope) and with a varying DC component (or background signal).

In terms of overlay performance, there are several issues when using a periodic fit on such an alignment mark, among which include the reproducibility (repro) due to the envelope of the alignment signal, poor accuracy due to crosstalk effects from structures next to the alignment mark and (for multi pitch marks) poor repro due to crosstalk between the pitches, distinct in angle and/or pitch for dual period oblique marks. The repro of a dual pitch alignment marks is significantly worse than single pitch gratings, mainly due to mixing (cross-talk) between the two effective pitches, which for a dual pitch oblique mark enables calculation of the X and Y position. This is particularly the case for a short scan length (e.g., less than 20 µm, less than 15 µm or less than 12 µm) over the alignment mark.

In a first embodiment, it is proposed that a modulation fit based algorithm is used in place of an FFT based algorithm for fitting the signal to the aligned position, while effectively dealing with alignment signal envelope. Two example modulation fit based approaches will be described:
 a) Hilbert Fit (HF). This algorithm is frequency domain based and uses bandpass filtering, the Hilbert transform and complex demodulation to determine the Aligned Position Deviation (APD);
 b) Sine Modulation Fit (SMF). This algorithm is time domain based, uses real sine and cosine demodulation and lowpass filtering to determine the APD.

Figure 4:
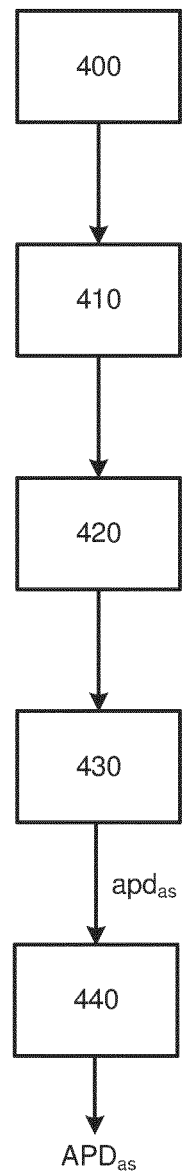
FIG. 4 is a flowchart of a first alignment fit method according to a first embodiment.

FIG. 4 is a flowchart describing an HF based algorithm, which is a complex demodulation of Hilbert transform of a band-filtered alignment signal. At step 400, a zero-phase bandpass filter $h_{bandpass}$ is used on the measured signal I(x) to isolate the diffraction order signal. At step 410, the filtered signal is complex Hilbert transformed, and at step 420, a complex demodulation is performed. By way of a specific example, steps 400, 410 and 420 may be performed as a single step according to the equations:

$$E_{cos}(x) = \text{real}\left\{\text{hilbert}(h_{bandpass} \otimes I(x)) \cdot e^{\frac{-2\pi jx}{L_{baseperiod}}}\right\}$$

$$E_{sin}(x) = \text{imag}\left\{\text{hilbert}(h_{bandpass} \otimes I(x)) \cdot e^{\frac{-2\pi jx}{L_{baseperiod}}}\right\}$$

where $L_{baseperiod}$ is the base period (or pitch) of the periodic mark.

At step 430, the local apd signal $apd_{as}(x)$ is calculated using complex angle; e.g., by:

$$apd_{as}(x) = \frac{L_{baseperiod}}{2\pi} \cdot \text{atan2}(-E_{sin}(x), -E_{cos}(x))$$

$$= -\frac{L_{baseperiod}}{2\pi} \cdot \text{angle}\left\{\text{hilbert}(h_{bandpass} \otimes I(x)) \cdot e^{\frac{-2\pi jx}{L_{baseperiod}}}\right\}$$

At step 440, the overall APD $APD_{as}$ is calculated by integrating over Hann window $w_{hann}(x)$ (Hann window center is optimized by performing multiple iterations):

$$APD_{as} = \frac{\int_x w_{hann}(x) \cdot apd_{as}(x) \cdot dx}{\int_x w_{hann}(x) \cdot dx}$$

$$= -\frac{L_{baseperiod}}{2\pi} \cdot \frac{\int_x w_{hann}(x) \cdot \text{angle}\left\{\text{hilbert}(h_{bandpass} \otimes I(x)) \cdot e^{\frac{-2\pi jx}{L_{baseperiod}}}\right\} dx}{\int_x w_{hann}(x) dx}$$

Figure 5:
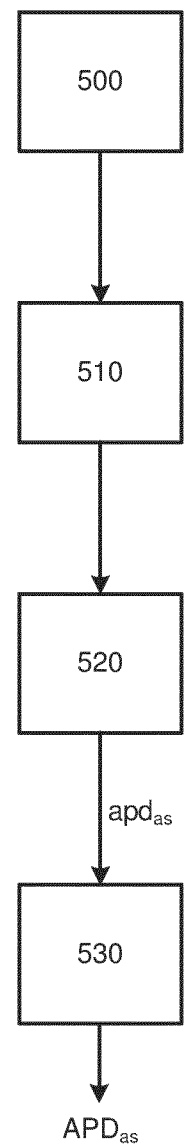
FIG. 5 is a flowchart of a second alignment fit method according to a second embodiment.

FIG. 5 is a flowchart describing an SMF based algorithm, which comprises a real sine and cosine demodulation of the alignment signal I(x) followed by a lowpass filter to remove harmonics. At step 500, a real demodulation is performed using sine and cosine signals and at step 510, a zero phase lowpass filter $h_{lowpass}$ is applied to block side bands; e.g., these steps may be represented as:

$$E_{cos}(x) = h_{lowpass} \otimes \left\{I(x) \cdot \cos\left(\frac{2\pi jx}{L_{baseperiod}}\right)\right\}$$

$$E_{sin}(x) = h_{lowpass} \otimes \left\{I(x) \cdot \sin\left(\frac{2\pi jx}{L_{baseperiod}}\right)\right\}$$

At step 520, the local APD signal $apd_{as}(x)$ is calculated using a tan 2:

$$apd_{as}(x) = \frac{L_{baseperiod}}{2\pi} \cdot \text{atan2}(-E_{sin}(x), -E_{cos}(x))$$

At step 530 the overall APD $APD_{as}$ is calculated by integrating over Hann window $w_{hann}(x)$ (Hann window center is optimized by performing multiple iterations):

$$APD_{as} = \frac{\int_x w_{hann}(x) \cdot apd_{as}(x) \cdot dx}{\int_x w_{hann}(x) \cdot dx}$$

$$= \frac{L_{baseperiod}}{2\pi} \cdot \frac{\int_x w_{hann}(x) \cdot \text{atan2}(-E_{sin}(x), -E_{cos}(x)) dx}{\int_x w_{hann}(x) dx}$$

Of course, in each of these examples, alignment in the y direction can be performed using the approach described for the Y-direction signal I(y).

In another embodiment, a Background Envelope Periodic Fit (BEPF) may be performed which comprises a least-squares fit of multiple modulated sine, cosine and DC signals for all orders within the alignment signal. This concept is based on extending the periodic signal model with enveloped periodic signals and background signals. This allows the algorithm to deal with small mark signals without using filtering and modulation techniques. Additionally, the extended model allows for oblique projection techniques to be used on the fit coefficients which can actively cancel out crosstalk disturbances on the alignment signal for specific adjacent structures and/or crosstalk between pitches of a dual direction mark. In the former case, the projection operator can be calibrated using simulations of the mark with adjacent specific crosstalk structures using an offline mark and sensor model simulation, or by means of actual measurement on such a mark. Therefore this approach can simultaneously address the issue of poor repro due to the envelope of the alignment signal and due to crosstalk between dual pitches and the issue of poor accuracy due to crosstalk effects from structures adjacent the alignment mark.

Figure 6:
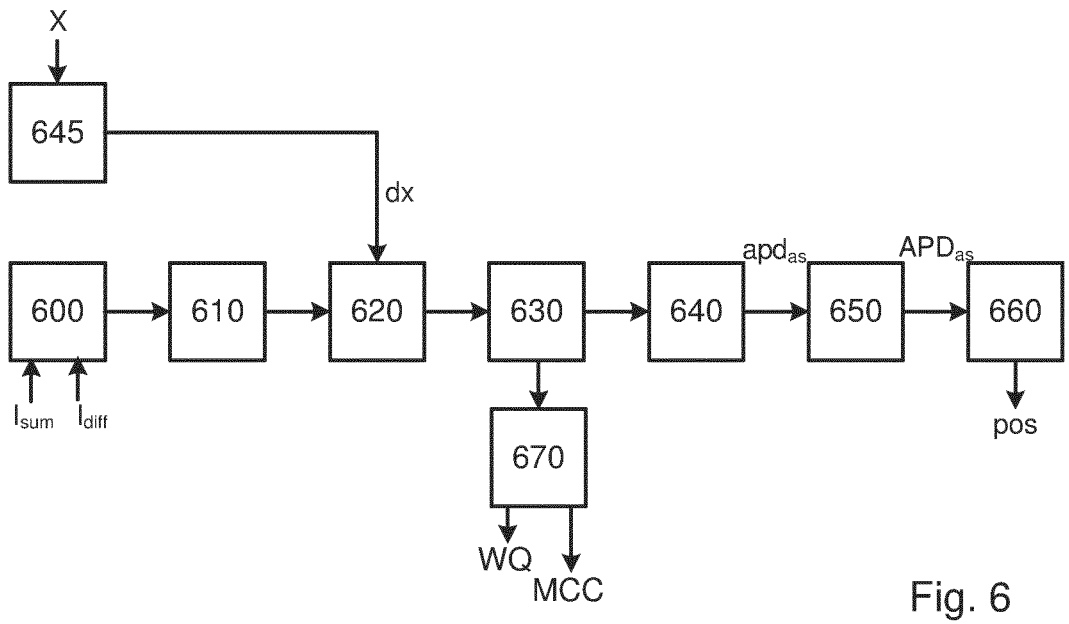
FIG. 6 is flowchart of a third alignment fit method according to a third embodiment for a 1 dimensional mark.

FIG. 6 comprises a flow diagram describing such a method. At step 600, the BEPF model matrices are calculated using a suitable model which enables the fitting of an arrangement of scanlength multiples, pitch and order dependent cosines and sines of which the amplitudes are described by a set of parameters.

A first model may take the form:

$$I(x) \approx \alpha + \beta \frac{2x}{l_{scan}} + \sum_{b=1}^{bg\,order} \gamma_b \cos\frac{2\pi bx}{l_{scan}} + \delta_b \sin\frac{2\pi bx}{l_{scan}} +$$

$$\sum_{o=1}^{order} \left( \varepsilon_o + \zeta_o \frac{2x}{l_{scan}} + \sum_e^{env\,order} \eta_{eo}\cos\frac{2\pi ex}{l_{scan}} + \theta_{eo}\sin\frac{2\pi ex}{l_{scan}} \right) \cdot \cos\frac{2\pi ox}{l_{baseperiod}} +$$

$$\sum_{o=1}^{order} \left( \kappa_o + \lambda_o \frac{2x}{l_{scan}} + \sum_e^{env\,order} \mu_{eo}\cos\frac{2\pi ex}{l_{scan}} + \nu_{eo}\sin\frac{2\pi ex}{l_{scan}} \right) \cdot \sin\frac{2\pi ox}{l_{baseperiod}}$$

A second model may take the form:

$$I(x) \approx \alpha \sum_{b=1}^{\frac{1}{2}N_{periods}-1} \beta_b \cos\frac{2\pi\left(b-\frac{1}{2}\right)x}{L_{scan}} +$$

$$\gamma_b \sin\frac{2\pi\left(b-\frac{1}{2}\right)x}{L_{scan}} + \mu \cos\frac{\pi N_{periods}x}{L_{scan}} + \nu \sin\frac{\pi N_{periods}x}{L_{scan}} +$$

$$\sum_o \left( \delta_o + \sum_{b=1}^{\frac{1}{2}N_{periods}-1} \varepsilon_{ob}\cos\frac{2\pi\left(b-\frac{1}{2}\right)x}{L_{scan}} + \zeta_{ob}\sin\frac{2\pi\left(b-\frac{1}{2}\right)x}{L_{scan}} \right) \cdot$$

$$\cos\frac{2\pi ox}{L_{baseperiod}} +$$

$$\sum_o \left( \eta_o + \sum_{b=1}^{\frac{1}{2}N_{periods}-1} \theta_{ob}\cos\frac{2\pi\left(b-\frac{1}{2}\right)x}{L_{scan}} + \iota_{ob}\sin\frac{2\pi\left(b-\frac{1}{2}\right)x}{L_{scan}} \right) \cdot \sin\frac{2\pi ox}{L_{baseperiod}}$$

The Model describes the background signal, the envelope and the periodic alignment signal by separate sets of parameters. More specifically, for each model:
The first line is the background signal model comprising the the DC and background terms (with model coefficients: $\alpha$, $\beta_b$, $\gamma_b$, including, in the second model, half order beat $\mu$, $\nu$).
The second line contains envelope signals for the cosine part of the alignment signal (with model coefficients for the first model: $\delta_o$, $\zeta_o$, $\eta_{eo}$, $\theta_{eo}$, and for the second model: $\delta_o$, $\varepsilon_{ob}$, $\zeta_{ob}$).
The third line contains envelope signals for the sine part of the alignment signal (with model coefficients for the first model: $\kappa_o$, $\lambda_o$, $\mu_{eo}$, $\nu_{eo}$, and for the second model: $\eta_o$, $\theta_{ob}$, $\iota_{ob}$).

The second of these models has orthogonal background and envelope functions and an improved overall condition number of the model matrix compared to the first model.

At step 610, a laser noise normalization LNN may be performed on the difference and sum signals $I_{diff}$, $I_{sum}$. This step may comprise the following sub-steps:
Calculate background signal of $I_{diff}$ and $I_{sum}$ by using background model of BEPF;
Normalize $I_{diff}$ and $I_{sum}$ with background signals;
Calculate g factor (g) as the ratio of the RMS normalized $I_{diff}$ to the RMS normalized $I_{sum}$;
Calculate normalized laser noise signal=$(I_{diff}+g*I_{sum})/(1+g)$; and
Divide original alignment signals $I_{diff}$ by laser noise signal (e.g., the normalized laser noise which is obtained from the ratio of the normalized difference and sum background signals from the BEPF model);

At step 620, a core fit of the BEPF is performed. The core fit algorithm may use the pre-calculated inverse matrix $M_{inv}$ to calculate the fit coefficients (e.g., fitted signal $c_{as}=M_{inv}xI$). This speeds up the calculation compared to a regular least squares fit algorithm.

In an embodiment, and in particular with respect to the second model described, a stage position measurement ($\Delta$SPM) signal may be fitted, using the envelope model E. This may comprise a fitting of a position difference signal dX determined (step 645) as a difference of the wafer stage position and a wafer stage setpoint signal (e.g., the expected position). This stage position measurement $\Delta$SPM signal describes the actual stage position with respect to an expected position (e.g., measured SPM minus the setpoint), such that the fitted $\Delta$SPM signal can be combined with the result of the core fit to yield an alignment signal. One reason for this is to allow for the fit coefficient rotation algorithm to work (see step 630 below). The core fit also calculates fit residual energy. After this step the raw alignment signal data is no longer needed. The fitting model for $\Delta$SPM may be substantially similar to the envelope or background model already described; e.g.:

$$\Delta SPM(x) = \alpha + \sum_{b=1}^{\frac{1}{2}N_{periods}-1} \beta_b \cos\frac{2\pi\left(b-\frac{1}{2}\right)x}{L_{scan}} + \gamma_b \sin\frac{2\pi\left(b-\frac{1}{2}\right)x}{L_{scan}}$$

In other embodiments, the stage position may be determined in other ways, as will be known to the skilled person.

Following this, at step 630, a fit coefficient rotation algorithm e.g., an oblique projection matrix may be applied; e.g., for crosstalk correction. The rotation step corrects for the fact that the expected position of the mark (i.e., where the scan is performed) does not match with the true position of the mark (i.e., the position being sought). The purpose of rotating the fit coefficients is to put the alignment scan approximately closer to the true mark location by moving it from the expected mark location to an approximate measured mark position. This is not a correction and in principle does not alter the aligned position, it only moves the center of the scan closer to the actual mark position. More details on this optional step will be provided below.

At step 640 the APD signal is calculated from the phase sensitive relation of the constituent cosine and sine amplitude, as performed for regular Fourier fit, but taking into account the shape of the envelope expressed as a sum of sines and cosines ranging over a set of fractions of the scan length; the amplitudes being described by a set of parameters offset by a DC value; e.g., according to the following steps:

Calculate envelope signals for use order; for the second model described, this may comprise:

$$E_{cos}(x) = \delta_o + \sum_{b=1}^{\frac{1}{2}N_{periods}-1} \varepsilon_{ob}\cos\frac{2\pi\left(b-\frac{1}{2}\right)x}{L_{scan}} + \zeta_{ob}\sin\frac{2\pi\left(b-\frac{1}{2}\right)x}{L_{scan}}$$

$$E_{sin}(x) = \eta_o + \sum_{b=1}^{\frac{1}{2}N_{periods}-1} \theta_{ob}\cos\frac{2\pi\left(b-\frac{1}{2}\right)x}{L_{scan}} + \iota_{ob}\sin\frac{2\pi\left(b-\frac{1}{2}\right)x}{L_{scan}}$$

Calculate alignment sensor APD signal;

$$apd_{as}(x) = \frac{L_{baseperiod}}{2\pi} \cdot \mathrm{atan2}(-E_{sin}(x), -E_{cos}(x))$$

At step 650 an iterative Hann window may be applied as with the modulation fit examples, so as to calculate the total APD signal $APD_{as}$. As the APD signal for small marks has an anti-symmetric behavior, there will be an APD impact if the Hann window is not centered close to the alignment position. Iterations of positioning the Hann window may be performed till the resulting APD is within a threshold (e.g., 1 picometer) of the alignment position. If there is no convergence within a threshold number of iterations (e.g., 5) then it is assumed that there is an error and the process stops.

Alternatively, instead of a Hann window iteration, step 630 may comprise shifting the alignment signal model by means of rotating the fit coefficients. In this implementation a single rotation suffices. The purpose of this step is to shift the location of the alignment signal to the center of the scan. Compared to the iterative Hann window, this implementation is expected to give a more accurate aligned position and to have a lower calculation footprint and allow for more easily and accurately calculated KPI's. In such an embodiment, a simpler fixed Hann window may still be applied. The process exists of 4 steps:

Calculate the APD estimation of the non-rotated fit coefficients;
Apply the shift to the background signal model;
Apply the shift to the envelopes; and
Apply the shift to the orders (carriers).

As all fit coefficients consist of cosine and sine functions, the shift can be implemented as a rotation of the cosine and sine pairs. As the described model has a desirable extrapolation behavior by design, and a Hann window may be used for the APD calculation which is zero at the end points of the scan, the APD impact of extrapolation is expected to be negligible.

At step 660, the expected position (setpoint) may be added to the total APD, to determine the aligned position pos.

Optionally, at step 670, the BEPF fit allows for intra-mark key performance indicators (KPIs) to be determined, such as a maximum correntropy criterion (MCC subspaces); e.g., according to:

$$MCC = 1 - \left(\frac{\mathrm{Noise}}{\mathrm{Signal}}\right)^2$$

MCC may be mostly sensor noise only. Signal distortion may be included in MCC subspaces in addition to a total MCC.

Another KPI may be wafer quality (WQ) qualification. The raw WQ may be calculated by:

rawWQ=sqrt(mean($E_{cos.}^2+E_{sin.}^2$)); (Definition based on rms envelope)

rawWQ=max(sqrt($E_{cos.}^2+E_{sin.}^2$)); (Alternative definition based on max order signal envelope).

The core idea for the MCC KPI is to split the BEPF model space into subspaces which cover expected alignment signal and various different distortion types. In MTDF, a model parameter base transformation matrix can be defined including the MCC subspaces split. Only KPIs for which validation is enabled need be calculated online; other KPIs can be calculated in offline tooling from logged fit coefficients. Examples of MCC subspace components may comprise, for example:

Background signal:
  slope+low frequent+half order beat;
  slope+symmetric+antisymmetric;
Envelope per order:
  slope+symmetric+antisymmetric;
Phase per order:
  symmetric+antisymmetric;
Repro:
  ARC components;
Crosstalk:
  ACC components;
Order-to-order:
  mismatch between orders (envelope, phase);
Periodic signals:
  deviation from pure periodic;
Small marks:
  deviation from expected signal subspace.

Next to the MCC subspace, also nanometer KPI's can be calculated from the APD signals, by calculating the (weighted) standard deviation from the symmetric and anti-symmetric parts of the APD signals.

The BEPF fit can be used in combination with 2D marks (e.g., dual directional). Such 2D marks may comprise co-arranged or overlaid x-oriented and y-oriented gratings (e.g., in 2 different layers or in a single layer), read using an oblique or slanted scan (e.g., neither parallel with x nor y) and/or may comprise multiple co-arranged or overlaid oblique gratings at different angles which are scanned along X or Y axis.

Figure 7:
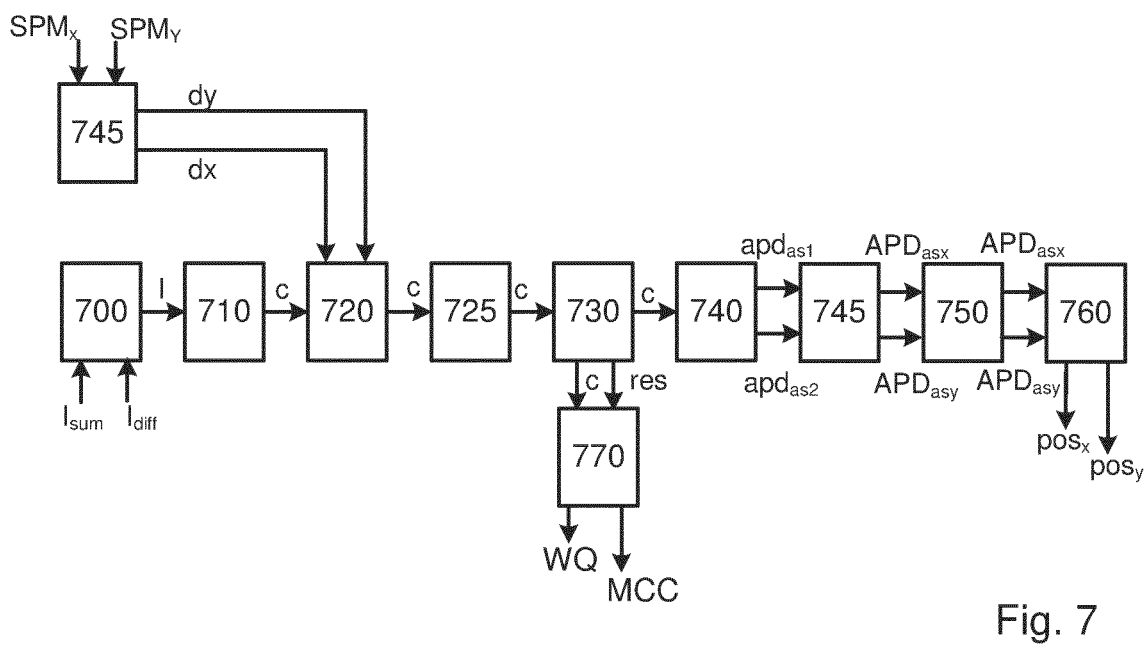
FIG. 7 is flowchart of the third alignment fit method according to the third embodiment for a 2 dimensional mark.

FIG. 7 is a flowchart describing such a 2D embodiment. Steps 700, 710, 720 and 745 are essentially similar to corresponding steps 600, 610, 620 and 645.

The core fit 720 may be performed on intensities I with an additional SPM fit (as has been described in the 1D target embodiment above), to yield fitted signal c.

In this embodiment, the core fit may also use a modified model for the envelopes, compared to the first BEPF model or second BEPF model disclosed above. This is because two orders are needed in the 2D fit in order to determine the two aligned positions in x and y. In such a case, the common base period of the two orders will often be too large such that only one or two base periods will fit within the scan length. The BEPF models in the form described above will therefore tend to result in no envelope model beyond DC. In the modified model, the concept of base period is abandoned and the maximum envelope order is based on the signal period rather than the common base period. As such, the envelope coefficient sin or cos $2\pi ox/L_{baseperiod}$ may be replaced by a coefficient based on the signal period and the maximum envelope order is allowed to be higher than the common base period such that the envelope may extend up to half of the actual signal period rather than half of the base period.

One consequence of the modified model just described is that this 2D BEPF model becomes ill conditioned. To address this, a regularization may be applied. In an embodiment, the regularization may comprise a second-order regularization to bias the fitting towards a solution with smooth envelope functions. More specifically, in an embodiment the regularization may take the form:

$$c = \underset{c}{\operatorname{argmin}}\left\{\|I - Mc\|^2 + \lambda \cdot \int_x \left|\frac{d^2 E_c(x)}{dx^2}\right|^2 dx\right\}$$

where $\lambda$ is the regularization parameter and $E_c(x)$ are the envelope signals of the model.

Regularization is on the second order derivative of these envelope functions for both the orders and the background signal. As the envelope and background signal model comprises sums of cosine and sine functions, analytical expressions for the integral can be derived. This approach is important for the 2D BEPF model, but can also provide stability improvements for the 1D BEPF model disclosed above. As such, this regularization may also be applied to the fitting of the 1D BEPF model embodiment described.

At step 725, a correction step may be performed, which may comprise performing one or more of: Active Repro Correction (ARC), order leakage correction (OLC) and weak half order correction (WOC). Each of ARC, OLC and WOC will be described below. Note that this step may be performed after the rotation step 730, or even split before and after rotation step 730; e.g., one or more of these corrections may be performed before step 730 and one or more of these corrections (e.g., not performed before) may be performed after this step. It is, however, simpler to perform ARC before step 730, on the non-rotated fit coefficients, although it could in theory be translated into a correction after rotation.

Steps 730 and 770 correspond to steps 630 and 660, although the rotation of the fit coordinates step 730 is now a 2D rotation, of course. At step 740, the APD signal is determined in a step corresponding to step 640, but in X and Y directions; as such there are now two channels, one per direction.

Step 745 comprises a coordinate transform step to transform from the determined APD values from the oblique coordinate system to an X/Y (Cartesian) coordinate system. At step 750, a (e.g., fixed) Hann window may be applied to each channel. At step 760, the expected position (setpoint) in each direction may be added to the respective total APD for that channel, to determine the aligned position pos.

To perform the BEPF fit, ideally the scan should provide an even number of signal periods for all diffraction orders (1D and 2D). The half order beat frequency may be included only in background signal and excluded only in envelope signals.

Figure 8:
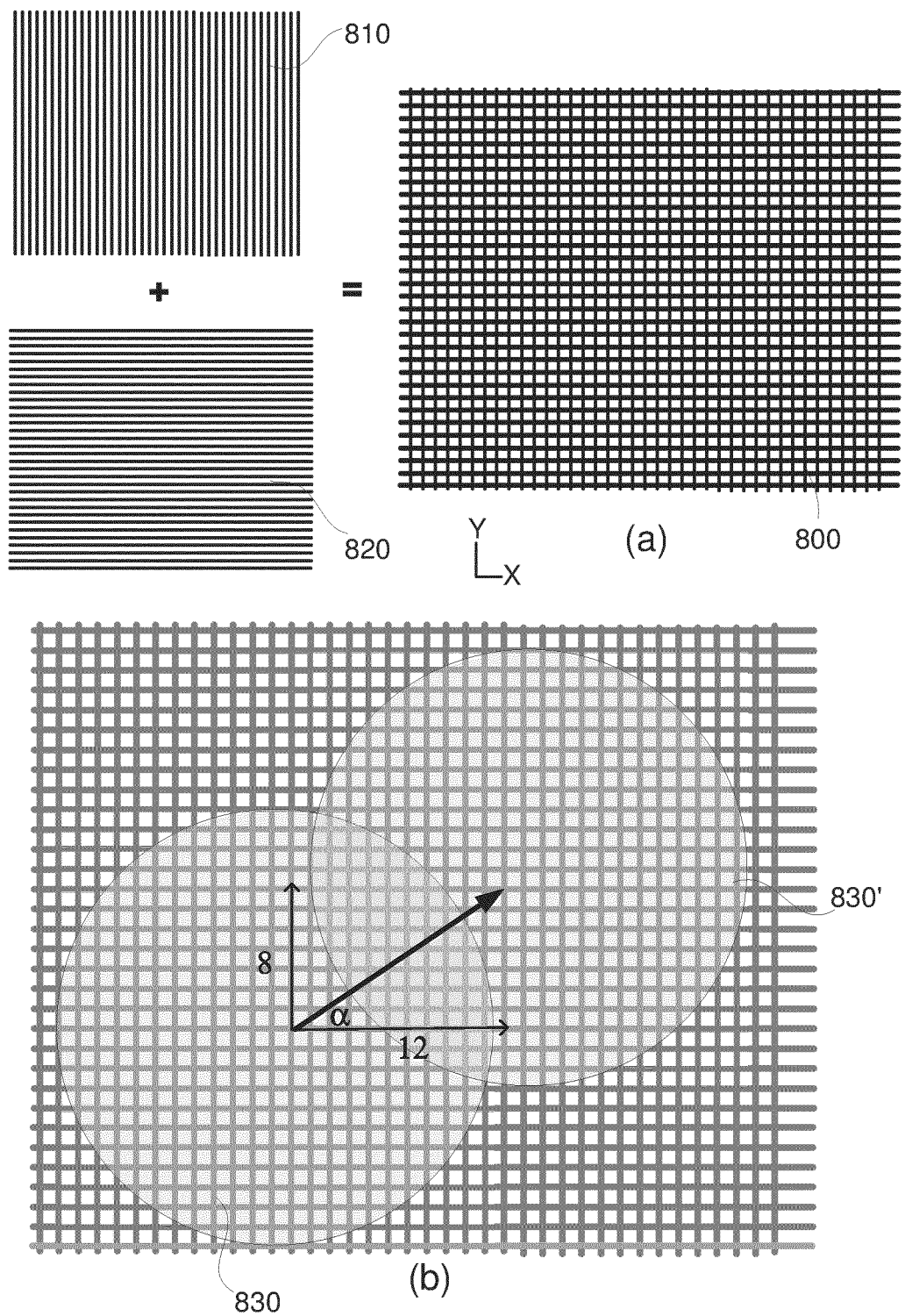
FIG. 8 depicts (a) a first dual direction alignment mark and (b) measurement thereof.

FIG. 8 illustrates an example of such a 2D or dual direction overlaid mark, with X and Y detectability. FIG. 8(a) shows the dual direction mark 800 comprising an X oriented grating 810 co-arranged (e.g., overlapped in a single layer or in two layers) with a Y oriented grating 820. FIG. 8(b) shows how such a mark may be scanned. A radiation spot of alignment radiation is shown in a first position 830 and a second position 830' during a scan in the direction of the arrow. The physical pitch of the X oriented grating 810 and Y oriented grating 820 are the same in this embodiment, however they could also be different. Whatever the physical pitches, the angle $\alpha$ of the scan (with respect to x) is oblique to enable separation of the X and Y signals, such that each has a different effective detection pitch in the scan direction. Here, the angle $\alpha$ is such that 12 lines are scanned of the X oriented grating 810 during the same time as 8 lines of the Y oriented grating 820 are scanned (e.g., $\alpha$=33.7 degrees), and therefore the detection pitch ratio X:Y in the scan direction is 2:3. Of course, such a mark may be oriented obliquely with respect to X and Y and scanned along one of X and Y.

Figure 9:
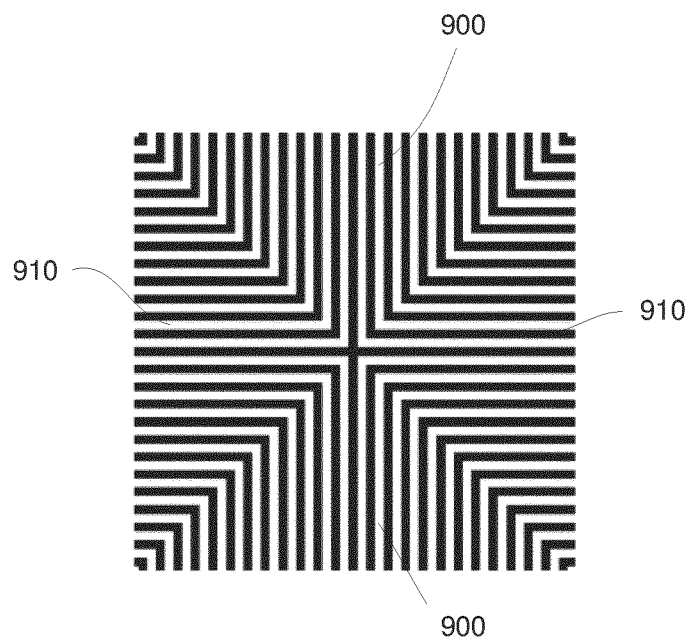
FIG. 9 depicts a second dual direction alignment mark.

FIG. 9 illustrates a second example of such a 2D or dual direction mark, with X and Y detectability. The mark comprises four triangular sections or sub-targets arranged to make a square or rectangular target. The sub-targets comprise two X-targets 900 and two Y targets 910. It is proposed, in an embodiment, that the mark be read with a small scan angle to increase the difference frequency between the two alignment signal components $\Delta f$ and therefore repro. In this case, it may be that ARC is not necessary, although it can be used to improve performance. ARC will be described immediately below.

A further embodiment, which may be implemented in combination, or independent of, the other 2D embodiments disclosed herein comprises Active Repro Correction (ARC). Due to the usage of two pitches for 2D marks (e.g., such as illustrated in FIG. 8 or FIG. 9), distinct in angle and/or pitch, the repro suffers from vibrations at frequencies close to the difference frequency between the two alignment signal components $\Delta f$ resultant from the two pitches. This has a greater impact at the slow scan speeds used to measure small marks. There is also more impact at strong signal amplitude differences (sub segmentation/polarization effects).

Figure 10:
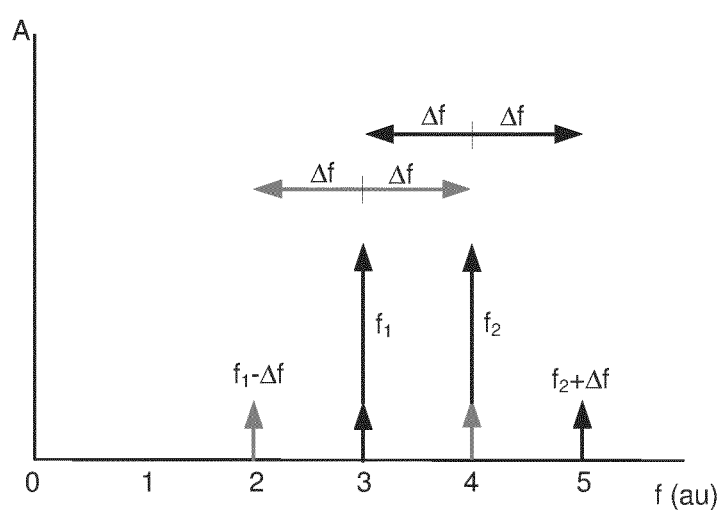
FIG. 10 is a plot of amplitude against frequency (arbitrary units on both axes) illustrating the concept of active repro correction.

FIG. 10 illustrates the issue addressed by ARC. Shown are two main orders at main alignment signal frequencies (target pitch frequencies in X and Y respectively) $f_1$ and $f_2$. As there are 2 frequencies in the alignment signal, the measured position (repro) has an increased sensitivity to vibrations at the difference frequency $\Delta f = f_2 - f_1$. This is illustrated in FIG. 10, which also shows that the disturbances at $\Delta f$ can be detected and corrected for by fitting 2 additional orders or "ARC orders". As such, each of these main orders comprise two additional frequency components or "ARC orders" $f_1 \pm \Delta f$ and $f_2 \pm \Delta f$. This will cause $f_1$ to be modulated on top of $f_2$ and vice versa, disturbing both alignment signal frequencies; i.e., each main order has modulated thereon an ARC order such that order $f_1$ has modulated thereon frequency component $f_2 - \Delta f$ and order $f_2$ has modulated thereon frequency component $f_1 + \Delta f$ Using a least-squares fit approach, for example, it is not possible to discriminate between the true alignment signal and the $\Delta f$ vibration impact. However in addition to the error at $f_1$ and $f_2$, $\Delta f$ will also cause frequency components at $f_1 - \Delta f$ ($= 2f_1 - f_2$) and $f_2 \Delta f$ ($= 2f_2 - f_1$) in the alignment signal. Provided that the alignment mark does not generate these frequency components by itself, these can be used to detect and correct the $\Delta f$ impact on repro. Three methods of achieving this will be described:

A first approach comprises adding the alignment signal disturbance due to vibrations at the difference frequency $\Delta f$ to the alignment signal model and fitting them together to the alignment signal. This creates an extended alignment signal model which includes the full $\Delta f$ vibration impact as model function.

A second approach comprises creating an oblique projection operator which operates on the raw alignment signal samples (e.g., the input difference and sum intensity signals $I_{sum}$, $I_{diff}$ comprising respectively the difference and sum of complementary diffracted orders) and blocks the alignment signal disturbance due to vibrations at difference frequency $\Delta f$, while passing through the alignment signal model functions. This may be implemented, for example, at step 630 of FIG. 6, step 725 of FIG. 7 or an equivalent step of the methods of FIG. 4 or 5 (not shown).

The second approach may comprise performing the following steps:
  Calculate alignment signal impact of $\Delta f$ vibration;
  Create oblique projection matrix which blocks $\Delta f$ impact and passes pure alignment orders;
  Apply oblique projection matrix to alignment signal prior to alignment fit.

The projection matrix may be calculated/optimized in (at least) three ways:
  Based on Dynamics Transfer Function simulations; the transfer functions can be calculated from the alignment signal. From this, the disturbance to the alignment signal resultant from the difference frequency $\Delta f$ can be determined and the oblique projection matrix which blocks this specific disturbance can be designed accordingly.
  Based on static scantest data from a scanner, the projection matrix may be optimized for best predicted repro;
  By using raw repro scans (i.e. repro scans that include raw alignment signals), the projection matrix may be optimized for best measured repro.

This oblique projection operator approach has the advantage that it can be used prior to any fit algorithm (e.g., periodic fit, HF, SMF, BEPF), while the first approach can only be used in case of fitting an alignment signal model (periodic fit, BEPF).

A third approach directly maps the fitted ARC order (e.g., $f_1-\Delta f$) onto the order to be corrected (e.g., $f_2$) using the physical relations between the fitted ARC order and the disturbance on the order to be corrected. In such an embodiment, the fitted ARC order is rotated and partially inverted to determine the correction. No scaling of the correction is needed: the disturbance on the main order is by theory equal in magnitude to the fitted ARC order. The rotation angle depends solely on the phase of the other main order. More specifically, the disturbance $\Delta I$ each order is:

$$\Delta I = A\{\cos(\omega t - \nu t + \varphi) - \cos(\omega t + \nu t + \varphi)\} + B\{\sin(\omega t - \nu t + \varphi) + \sin(\omega t + \nu t + \varphi)\}$$

where $\omega = 2\pi f_1$ (or $2\pi f_2$ depending on which order is being corrected) and $\nu = 2\pi \Delta f$. The ARC correction, based on a rotation through angle $\varphi$, is applied by rotation matrix R and partial inversion matrix D:

$$R = \begin{pmatrix} \cos\varphi & -\cos\varphi \\ \sin\varphi & \cos\varphi \end{pmatrix}$$

$$D = \begin{pmatrix} -1 & 0 \\ 0 & 1 \end{pmatrix}$$

Therefore the full transformation to determine the correction may be applied by:

$$RDR^T = \begin{pmatrix} -\cos^2\varphi + \sin^2\varphi & -2\cos\varphi\sin\varphi \\ -2\cos\varphi\sin\varphi & \cos^2\varphi - \sin^2\varphi \end{pmatrix}$$

For best performance, the disturbance signals for the first approach or the projection matrix of the second approach may use the following alignment signal knowledge (e.g., as part of a calibration):
  kx+ky for all orders: these are known from the mark design. These are 2D spatial frequencies of the alignment signal components. The 2D alignment signal is given by sum over_i for:

$$A(i)\cos(kx(i)*x+ky(i)*y)+B(i)\sin(kx(i)*x+ky(i)*y)$$

Relative strength and approximate phase of alignment orders: these can be best detected on the fly from the measured alignment signal, although a crude simulation or model might also be sufficient to provide repro improvement;
  The envelope of the alignment signal orders: these can also be detected on the fly from the measured alignment signal, but may as well be obtained from a (simplified) model of the alignment signal.

The 2D BEPF fit in combination with 2D marks is found to suffer from a scan offset impact. The fit is particularly sensitive to lateral scan offsets. Two phenomenon have been identified as a root cause for this:
  Order leakage: the 2D BEPF fit needs to fit at least two orders. The envelopes of the orders in combination with the envelope model in the BEPF fit results in crosstalk between the orders, implying a scan offset impact. The optional regularization described above may also have an order leakage impact.
  Weak half orders: depending on the actual tool used for metrology, weak half orders may be generated. This is particularly the case for a self-referencing interferometer based alignment tool. These weak half orders are not physically present in the pupil plane of the optics, but are generated by the self-referencing signal formation. The weak half orders depend on the beam size: for an infinite alignment beam the weak half orders are absent, but at finite beam size they become non-zero. The smaller the beam size, the stronger these weak half orders tend to become. The half order beat appearing on periodic marks is an example of such weak half orders. If the weak half orders overlap with the real orders of the BEPF fit, by occurring at the same or at a nearby frequency, they induce a scan offset impact. Weak half orders are typically too weak to fit and correct in a manner similar to ARC. As the weak half orders depend on the strong orders, they may be synthesized artificially from the strong orders: a weak half order is the result of a combination of two real orders, where the amplitude of the weak half order is proportional to the square root of the product of the amplitudes of the real orders. The phase signal of the weak half order is then equal to the average phase signal of the two real orders.

A set of correction methods will be described to correct for this scan offset impact due to order leakage and weak half order. These methods may be referred to as Order Leakage Correction (OLC) and Weak half order Correction (WOC), and may be applied at step 730 of FIG. 7, for example. OLC may comprise compensating for leakage from one or more orders to another impacted order by cancelling for the leakage, e.g., by mixing of the orders into the impacted order. By this mixing, the leakage impact on the aligned position can be cancelled or compensated for by using appropriate mixing gain values. The mixing gains may be calibrated by measuring the lateral and longitudinal scan offset impact on a 2D mark and directly optimizing the mixing gains for zero APD impact (i.e., to minimize APD impact) and/or lowest scan offset impact.

WOC works in a similar way, but the mixing includes mixing of artificially synthesized weak half orders corresponding to the weak half orders generated. In a case where the alignment signal has balanced diffraction orders, the electric field (image) of the alignment mark may be described as:

$$E(x,y) = \sum_n A_n \cdot \cos\left(\frac{1}{2}k_{xn}x + \frac{1}{2}k_{yn}y + \frac{1}{2}\varphi_n\right)$$

The alignment signal may be described by:

$$I(x,y) = \sum_n \frac{1}{2} G_{nn} \cdot A_n^2 + \sum_n G_{nn} \cdot A_n^2 \cdot \cos(\varphi_n) \cdot \cos(k_{xn}x + k_{yn}y) + $$
$$\sum_n G_{nn} \cdot A_n^2 \cdot \sin(\varphi_n) \cdot \sin(k_{xn}x + k_{yn}y) + $$
$$\sum_n \sum_{m<n} G_{nm} \cdot A_n A_m \cos\left(\frac{1}{2}\varphi_n - \frac{1}{2}\varphi_m\right) \cdot \cos\left(\frac{1}{2}(k_{xn} - k_{xm})x + \frac{1}{2}(k_{yn} - k_{ym})y\right) - $$
$$\sum_n \sum_{m<n} G_{nm} \cdot A_n A_m \sin\left(\frac{1}{2}\varphi_n - \frac{1}{2}\varphi_m\right) \cdot \sin\left(\frac{1}{2}(k_{xn} - k_{xm})x + \frac{1}{2}(k_{yn} - k_{ym})y\right) - $$
$$\sum_n \sum_{m<n} G_{nm} \cdot A_n A_m \cos\left(\frac{1}{2}\varphi_n + \frac{1}{2}\varphi_m\right) \cdot \cos\left(\frac{1}{2}(k_{xn} + k_{xm})x + \frac{1}{2}(k_{yn} + k_{ym})y\right) + $$
$$\sum_n \sum_{m<n} G_{nm} \cdot A_n A_m \sin\left(\frac{1}{2}\varphi_n + \frac{1}{2}\varphi_m\right) \cdot \sin\left(\frac{1}{2}(k_{xn} + k_{xm})x + \frac{1}{2}(k_{yn} + k_{ym})y\right)$$

where the first term is the DC signal, the next two terms are the contribution of the strong regular orders, while the final four terms are the contribution of the weak half orders. The modulated beam factor $G_{nm}$ for the weak half orders may be described by:

$$G_{nm} = 2 \int B(x',y') \left\{ \cos\left(\frac{1}{2}(k_{xn} - k_{xm})x' + \frac{1}{2}(k_{yn} - k_{ym})y'\right) - \cos\left(\frac{1}{2}(k_{xn} + k_{xm})x' + \frac{1}{2}(k_{yn} + k_{ym})y'\right) \right\} dx' dy'$$

where B(x',y'): is the beam shape: light intensity of the beam as a function of x and y.

The amplitudes $A_n^+$, $A_n^-$ are known, as is the beam factor $G_{nn}$. As such, the strong orders can be fitted and their strength calculated. The weak half orders can be calculated (synthesized) and a calibration performed to correct the strong orders for the impact of the weak half orders. This method may comprise mixing the strong orders with the synthesized weak half orders and optimizing the mixing gains for zero APD impact and/or lowest scan offset impact, as with OLC. As such, OLC and WOC may be performed as a single correction.

For completion, when the alignment signal has unbalanced orders, the alignment signal may be described by:

$$E(x,y) = \frac{1}{2}\sum_n A_n^+ \cdot e^{\frac{1}{2}j(k_{xn}x + k_{yn}y + \varphi_n^+)} + A_n^- \cdot e^{-\frac{1}{2}j(k_{xn}x + k_{yn}y + \varphi_n^-)},$$

the alignment signal described by:

$$I(x,y) = \sum_n \frac{1}{2} G_{nn} \cdot \{A_n^+ A_n^+ + A_n^- A_n^-\} + $$
$$\sum_n G_{nn} \cdot \left\{ A_n^+ A_n^- \cos\left(\frac{1}{2}\varphi_n^+ + \frac{1}{2}\varphi_n^-\right) \right\} \cdot \cos(k_{xn}x + k_{yn}y) + $$
$$\sum_n G_{nn} \cdot \left\{ A_n^+ A_n^- \sin\left(\frac{1}{2}\varphi_n^+ + \frac{1}{2}\varphi_n^-\right) \right\} \cdot \sin(k_{xn}x + k_{yn}y) + $$
$$\sum_n \sum_{m<n} G_{nm} \cdot \left\{ A_n^+ A_m^+ \cos\left(\frac{1}{2}\varphi_n^+ - \frac{1}{2}\varphi_m^+\right) + A_n^- A_m^- \cos\left(\frac{1}{2}\varphi_n^- - \frac{1}{2}\varphi_m^-\right) \right\} \cdot $$
$$\cos\left(\frac{1}{2}(k_{xn} - k_{xm})x + \frac{1}{2}(k_{yn} - k_{ym})y\right) - $$
$$\sum_n \sum_{m<n} G_{nm} \cdot \left\{ A_n^+ A_m^+ \sin\left(\frac{1}{2}\varphi_n^+ - \frac{1}{2}\varphi_m^+\right) + A_n^- A_m^- \sin\left(\frac{1}{2}\varphi_n^- - \frac{1}{2}\varphi_m^-\right) \right\} \cdot $$
$$\cos\left(\frac{1}{2}(k_{xn} - k_{xm})x + \frac{1}{2}(k_{yn} - k_{ym})y\right) - $$
$$\sum_n \sum_{m<n} G_{nm} \cdot \left\{ A_n^+ A_m^+ \cos\left(\frac{1}{2}\varphi_n^+ + \frac{1}{2}\varphi_m^+\right) + A_n^- A_m^- \cos\left(\frac{1}{2}\varphi_n^- + \frac{1}{2}\varphi_m^-\right) \right\} \cdot $$
$$\cos\left(\frac{1}{2}(k_{xn} + k_{xm})x + \frac{1}{2}(k_{yn} + k_{ym})y\right) + $$
$$\sum_n \sum_{m<n} G_{nm} \cdot \left\{ A_n^+ A_m^+ \sin\left(\frac{1}{2}\varphi_n^+ + \frac{1}{2}\varphi_m^+\right) + A_n^- A_m^- \sin\left(\frac{1}{2}\varphi_n^- + \frac{1}{2}\varphi_m^-\right) \right\} \cdot $$
$$\sin\left(\frac{1}{2}(k_{xn} + k_{xm})x + \frac{1}{2}(k_{yn} + k_{ym})y\right)$$

and the modulated beam factor $G_{nm}$ for the weak half orders described by:

$$G_{nm} = 2 \int B(x',y') \left\{ \cos\left(\frac{1}{2}(k_{xn} - k_{xm})x' + \frac{1}{2}(k_{yn} - k_{ym})y'\right) - \cos\left(\frac{1}{2}(k_{xn} + k_{xm})x' + \frac{1}{2}(k_{yn} + k_{ym})y'\right) \right\} dx' dy',$$

The OLC and WOC methods are good for suppressing the scan offset impact when the scan offsets are below 100 nm. For larger scan offsets, it may be that these corrections are inadequate. Furthermore it has been observed that OLC/WOC is unable to correct for sub-segmented marks when calibrated on a non-sub-segmented mark or a mark with a different sub-segmentation. Also, additional effects due to finiteness of the alignment mark gratings and corners in the mark design contribute to the scan offset impact. To address this, a more empirical method will be described which overcomes the limitations of the OLC/WOC method. In such a method, a correction $\Delta c$ to be applied to the fit coefficients $d_{knm}$ may be described by lateral scan offset correction model:

$$\Delta c = c_{no\ scan\ offset} - c_{rot} = \sum_k g_k(wq_{ord}) \cdot \sum_{n,m} d_{knm} x_{lat}^n x_{long}^m.$$

where $g_k$ is the scaling function which determines how the corrections scale with the wafer quality wq (a signal amplitude metric, equal to the RMS signal amplitude; other signal amplitude metrics may be used) of the fitted orders, $x_{lat}$ and $x_{long}$ are the lateral and longitudinal scan offset coordinates and $d_{knm}$ comprises the correction fit coefficients per scaling function and polynomial term for the scan offsets. In practice only a few polynomial terms for the scan offset coordinates $x_{lat}$ and $x_{long}$ are required, and because the aligned position of the scan is only affected by anti-symmetrical part of the lateral scan offset impact on the rotated alignment signal, the polynomial terms can be limited to antisymmetric only (i.e., m+n is odd). $d_{knm}$ may be calibrated by performing scans with multiple scan offsets on multiple marks which capture the relevant sub-segmentation aspects, including WQ/signal amplitude imbalance and other mark properties which affect the lateral scan offset impact. An appropriate set of scaling function $g_k$ may be determined, e.g., for the weak half orders which are based on (e.g., scales with) the square root of the product of amplitudes $A_n$, $A_m$. The correction fit coefficients $d_{knm}$ may be optimized for minimal variation of the rotated fit coefficients for all scan offsets and marks.

It has been observed that the BEPF (in both 1D and 2D variants) suffers from period jumps in case of large color-to-color shifts (e.g., where the image shifts from color-to-color of the measurement radiation used). The alignment signal may be rotated to the wrong signal period resulting in an incorrect aligned position. To address this, two improvements are proposed which may be used individually or in combination:

A first improvement may comprise a position correction based on (inline) color-to-color (and optionally mark type specific offsets: small mark specific offsets on top of the larger color-to-color and polarization-to-polarization differences that exist in a sensor) offsets for the marks and colors used. In the context herein, color-to-color includes any variation between measurement channels, and therefore may include variation between polarizations in addition to wavelength. As such, each measurement channel may relate to a different wavelength, polarization or combination thereof. The correction may be implemented on the APD which is calculated before rotation of the fit coefficients. As such, this approach comprises calibrating the color-to-color offset and correcting for this offset. Large color-to-color offset values are the main cause for period jumps and can be avoided this way. The second improvement may comprise unwrapping the APD signal (local phase signal) to avoid period jumps inside the APD signal. As large phase shifts usually appear near the start and end of the scan, the center of the APD signal is most robust. Because of this, it is proposed that the unwrapping is done in two steps, starting each time from the center of the scan and running to the left and right respectively. Phase unwrapping and unwrapping functions are well known to the skilled person, who can readily adapt a standard approach to one where the unwrapping is from the center.

In a further embodiment, which in a first implementation may be implemented in combination with the BEPF (or other alignment signal model embodiment) is a crosstalk mitigation method referred to herein as Active Crosstalk Correction ACC. Product structures next to the mark may have impact on alignment signal (APD), which will vary with process and stack variations.

ACC may be based on an oblique projection on the fit coefficients (e.g., of either model explicitly described or any other suitable model) resulting from the BEPF fit algorithm disclosed above. A proposed ACC method may comprise the following steps:

Simulate (or measure) alignment signal impact;
Create oblique projection matrix to block BEPF alignment signal impact;
Apply oblique projection matrix on BEPF fit coefficients.

A specific correction matrix for active crosstalk correction expressing a parameter set of the BEPF model may take the form (e.g., for the second model described above):

$$\begin{pmatrix} \delta_{o'} \\ \varepsilon_{ob} \\ \zeta_{ob} \\ \eta_o \\ \theta_{ob} \\ \iota_{ob} \end{pmatrix} = M \times \begin{pmatrix} \alpha \\ \beta_b \\ \gamma_b \\ \mu \\ \nu \\ \delta_{o'} \\ \varepsilon_{ob} \\ \zeta_{ob} \\ \eta_o \\ \theta_{ob} \\ \iota_{ob} \end{pmatrix} + \Delta$$

This enables filtering out the impact of the disturbing background signals.

Only correction for the enveloped sine and cosine fit coefficient is relevant. This is the most generic linear correction form for the fit coefficients. In practice only one or a few relevant fit coefficients should be selected for the correction, so the matrix M will be very sparse. The approach requires knowledge of mark surroundings. Various calibration methods are possible, and the approach may be based on pure simulation. The actual optimization may optimize towards overlay data.

Alternatively, ACC may be applied using a method similar to the aforementioned ARC embodiment; i.e., implemented as an oblique projection operator on the raw alignment signal, such that it blocks the specific crosstalk impact on the alignment signal prior to the alignment fit. In this way ACC becomes independent of the fit algorithm used and is therefore applicable to the other modulation fit algorithms disclosed herein. Furthermore, ARC and ACC can be combined into a single projection matrix which mitigates both $\Delta f$ repro disturbance and crosstalk disturbance from the raw alignment signal.

It is proposed that the concepts described may enable (e.g., XY) detection using underfilled marks from a single scan on a small (e.g., 50×50 µm) mark. Such a method may require only a 12 µm scan length) for sufficient repro.

While specific embodiments of the invention have been described above, it will be appreciated that the invention may be practiced otherwise than as described.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention may further be described using the following clauses.

1. A method of performing a position measurement on an alignment mark comprising at least a first periodic structure having a direction of periodicity along a first direction; the method comprising:
    obtaining signal data relating to the position measurement; and
    fitting the signal data to determine a position value; wherein the fitting step uses one of:
    a modulation fit; or
    a background envelope periodic fit.
2. A method as claimed in clause 1, wherein said fitting step uses a Hilbert modulation fit.
3. A method as claimed in clause 2, wherein the Hilbert modulation fit comprises a complex demodulation of a Hilbert transform of band-filtered said signal data.
4. A method as claimed in clause 1, wherein said fitting step uses a sine modulation fit.
5. A method as claimed in clause 4, wherein the sine modulation fit comprises a lowpass filtered, real sine and cosine demodulation of said signal data.
6. A method as claimed in clause 1, wherein said fit comprises said background envelope periodic fit and wherein the background envelope periodic fit comprises extending a periodic signal model describing the signal data with enveloped periodic signals and background signals.
7. A method as claimed in clause 6, wherein said background envelope periodic fit comprises a fit of multiple modulated sine, cosine and DC signals for all orders within the signal data.
8. A method as claimed in clause 7, wherein said fit of multiple modulated sine, cosine and DC signals comprises a least-squares fit.
9. A method as claimed in any of clauses 6 to 8, comprising dividing the periodic signal model space into subspaces which cover expected signal data values and various different distortion types.
10. A method as claimed in clause 9, comprising defining a model parameter base transformation matrix including the subspaces.
11. A method as claimed in any of clauses 6 to 10, wherein the alignment mark comprises a dual direction alignment mark comprising said first periodic structure arranged with a second periodic structure having a direction of periodicity in a second direction different from said first direction; and the method further comprises scanning the alignment mark obliquely to the first direction and second direction, such that a first direction component of the signal data is differentiated from a second direction component of the signal data by having a different effective pitch in the scan direction.
12. A method as claimed in any of clauses 6 to 10, wherein the alignment mark comprises a dual direction alignment mark comprising four triangular sections or sub-marks arranged to make a square or rectangular mark, wherein said sub-marks comprise two of said first periodic structures and two second periodic structures having a direction of periodicity in a second direction different from said first direction; and the method further comprises scanning the alignment mark obliquely to the first direction and second direction to increase the difference frequency between the first direction component and second direction component.
13. A method as claimed in clauses 11 or 12, comprising applying a correction for signal disturbance due to vibrations at a difference frequency corresponding to the difference of a first frequency in the signal data relating to a first effective pitch of said different effective pitches and a second frequency in the signal data relating to a second effective pitch of said different effective pitches.
14. A method as claimed in clause 13, wherein said correction for signal disturbance is applied by adding said signal disturbance at the difference frequency to said periodic signal model and fitting them together to the signal data.
15. A method as claimed in clause 13, wherein said correction for signal disturbance is applied by characterizing a signal frequency component corresponding to said signal disturbance and mapping the characterized signal frequency component onto the order to be corrected.
16. A method as claimed in clause 15, wherein said mapping comprises rotating the characterized signal frequency component and partially inverting the rotated signal frequency component.
17. A method as claimed in any of clauses 6 to 16, comprising compensating for leakage from one or more diffraction orders to a main diffraction order relating to the signal data; the method comprising mixing said one or more diffraction orders into said main diffraction order with a mixing gain; said mixing gain being optimized to minimize leakage impact on said position value.
18. A method as claimed in clause 17, further comprising synthesizing weak half orders corresponding to generated weak half orders which impact said signal data; wherein said mixing comprises additionally mixing the synthesized weak half orders into said main diffraction order, such that said optimized mixing gain also minimizes the impact of the weak half orders on said position value.
19. A method as claimed in any of clauses 6 to 18, comprising creating a fit coefficient correction algorithm which operates on fit coefficients of said periodic signal model so as to block impact on said signal data resulting from crosstalk of neighboring structures which neighbor said alignment mark.
20. A method as claimed in clause 19, wherein the fit coefficient correction algorithm comprises an oblique projection operator.
21. A method as claimed in clause 19 or 20, wherein said fit coefficient correction algorithm operates only on fit coefficients corresponding to said enveloped periodic signals.
22. A method as claimed in clause 19, 20 or 21, comprising an initial step of selecting only a subset of said fit coefficients based on knowledge of said neighboring structures.
23. A method as claimed in any of clause 19 to 22, comprising determining a lateral scan offset correction from a lateral scan offset correction model based on an amplitude metric of the fitted signal data scaled by a scaling function, correction fit coefficients per scaling function and a polynomial term for lateral and longitudinal scan offsets; the method comprising optimizing the correction fit coefficients for minimal variation of rotated fit coefficients obtained from said fit coefficient correction algorithm, for different scan offsets and/or alignment marks.
24. A method as claimed in any of clauses 6 to 23, comprising regularizing said background envelope periodic fit so as to bias the fitting towards a solution with smooth envelope functions.
25. A method as claimed in any of clauses 6 to 24, comprising calibrating a wavelength dependent contribution in the signal data and correcting the position value for this wavelength dependent contribution.
26. A method as claimed in any of clauses 6 to 25, comprising performing an unwrapping of the signal data from a center of a scan over the alignment mark towards each end of the scan.
27. A method as claimed in clauses 13, wherein said applying a correction comprises using additional frequency components in the signal data caused by the signal disturbance at the difference frequency to detect and determine the correction for the signal disturbance.
28. A method as claimed in clause 26 or 27, comprising creating an oblique projection operator which operates on the signal data and blocks said signal disturbance due to vibrations at the difference frequency, while passing model functions describing the signal data at the first frequency and second frequency.
29. A method as claimed in clause 28, wherein said oblique projection operator is further operable to block crosstalk signal impact in the signal data resulting from crosstalk of neighboring structures which neighbor said alignment mark.
30. A method as claimed in any of clauses 1 to 28, comprising creating an oblique projection operator which operates on the signal data and blocks the signal data resulting from crosstalk of neighboring structures which neighbor said alignment mark.
31. A method of performing a position measurement on a dual direction alignment mark comprising a first periodic structure arranged with a second periodic structure having a direction of periodicity in a second direction different to said first direction; said mark being configured to be scanned obliquely to the first direction and second direction; the method comprising:
obtaining signal data relating to the position measurement, the signal data comprising at least a first direction component relating to a first effective pitch detected during said oblique scan and a second direction component of the signal data related to a second effective pitch detected during said oblique scan direction; and
applying a correction for signal disturbance due to vibrations at a difference frequency corresponding to the difference of a first frequency in the signal data relating to the first effective pitch and a second frequency in the signal data relating to the second effective pitch.
32. A method as claimed in clause 31, wherein said applying a correction comprises using additional frequency components in the signal data caused by the signal disturbance at the difference frequency to detect and determine the correction for the signal disturbance.

33. A method as claimed in clause 31 or 32, comprising creating an oblique projection operator which operates on the signal data and blocks said signal disturbance due to vibrations at the difference frequency, while passing model functions describing the signal data at the first frequency and second frequency.
34. A method as claimed in clause 33, wherein said oblique projection operator is further operable to block crosstalk signal impact in the signal data resulting from crosstalk of neighboring structures which neighbor said alignment mark.
35. A method of performing a position measurement on an alignment mark comprising at least a first periodic structure having a direction of periodicity along a first direction; the method comprising: obtaining signal data relating to the position measurement; and
creating an oblique projection operator which operates on the signal data and blocks the signal data resulting from crosstalk of neighboring structures which neighbor said alignment mark.
36. A method as claimed in any preceding clause, comprising the steps of:
scanning a measurement beam over at least a portion of said alignment mark; and
detecting said scattered radiation, scattered by the alignment mark to obtain said signal data.
37. A method as claimed in any preceding clause, wherein the length of the scan in said scanning step is less than 15 μm.
38. A computer program comprising computer readable instruction operable to perform the method of any of clauses 1 to 37.
39. A processor and associated storage medium, said storage medium comprising the computer program of clause 38 such that said processor is operable to perform the method of any of clauses 1 to 37.
40. A metrology device comprising the processor and associated storage medium of clause 39, the metrology device being operable to perform the method of any of clauses 36 or 37.
41. A lithographic apparatus comprising the metrology device of clause 40.
42. A lithographic apparatus as claimed in clause 41, comprising:
a patterning device support for supporting a patterning device;
a substrate support for supporting a substrate; and
wherein the metrology device is operable to determine an aligned position for one or both of the patterning device support and substrate support.

The invention claimed is:
1. A method of performing a position measurement on an alignment mark comprising at least a first periodic structure having a direction of periodicity along a first direction and at least a second periodic structure having a direction of periodicity in a second direction different the first direction, the method comprising:
obtaining signal data relating to the position measurement wherein the alignment mark is scanned obliquely to the first direction and second direction, such that a first direction component of the signal data is differentiated from a second direction component of the signal data by having a different effective pitch in the scan direction; and
fitting the signal data to determine a position value, wherein the fitting uses a background envelope periodic fit, wherein the background envelope periodic fit com- prises extending a periodic signal model describing the signal data with enveloped periodic signals and background signals.

2. The method as claimed in claim 1, wherein the alignment mark comprises four triangular sections or sub-marks arranged to make a square or rectangular mark, wherein the sub-marks comprise two of the at least one first periodic structure and two of the at least one second periodic structure and comprising scanning the alignment mark obliquely to the first direction and second direction to increase the difference frequency between the first direction component and second direction component.

3. The method as claimed in claim 1, further comprising applying a correction for signal disturbance due to vibrations at a difference frequency corresponding to the difference of a first frequency in the signal data relating to a first effective pitch of the different effective pitches and a second frequency in the signal data relating to a second effective pitch of the different effective pitches.

4. The method as claimed in claim 3, wherein the correction for signal disturbance is applied by adding the signal disturbance at the difference frequency to the periodic signal model and fitting them together to the signal data.

5. The method as claimed in claim 3, wherein the correction for signal disturbance is applied by characterizing a signal frequency component corresponding to the signal disturbance and mapping the characterized signal frequency component onto an order to be corrected.

6. The method as claimed in claim 3, wherein the applying a correction comprises using additional frequency components in the signal data caused by the signal disturbance at the difference frequency to detect and determine the correction for the signal disturbance.

7. The method as claimed in claim 1, further comprising compensating for leakage from one or more diffraction orders to a main diffraction order relating to the signal data and mixing the one or more diffraction orders into the main diffraction order with a mixing gain, the mixing gain optimized to minimize leakage impact on the position value.

8. The method as claimed in claim 7, further comprising synthesizing weak half orders corresponding to generated weak half orders which impact the signal data and wherein the mixing comprises additionally mixing the synthesized weak half orders into the main diffraction order, such that the optimized mixing gain also minimizes the impact of the weak half orders on the position value.

9. The method as claimed in claim 1, further comprising creating a fit coefficient correction algorithm which operates on fit coefficients of the periodic signal model so as to block impact on the signal data resulting from crosstalk of neighboring structures which neighbor the alignment mark.

10. The method as claimed in claim 9, further comprising determining a lateral scan offset correction from a lateral scan offset correction model based on an amplitude metric of the fitted signal data scaled by a scaling function, correction fit coefficients per scaling function and a polynomial term for lateral and longitudinal scan offsets and optimizing the correction fit coefficients for minimal variation of rotated fit coefficients obtained from the fit coefficient correction algorithm, for different scan offsets and/or alignment marks.

11. The method as claimed in claim 1, further comprising calibrating a wavelength dependent contribution in the signal data and correcting the position value for this wavelength dependent contribution.

12. The method as claimed in claim 11, further comprising creating an oblique projection operator which operates on the signal data and blocks the signal disturbance due to vibrations at the difference frequency, while passing model functions describing the signal data at the first frequency and second frequency.

13. The method as claimed in claim 12, wherein the oblique projection operator is further operable to block crosstalk signal impact in the signal data resulting from crosstalk of neighboring structures which neighbor the alignment mark.

14. A computer program product comprising a non-transitory computer-readable medium comprising computer readable instructions therein, the instructions, when executed by a computer system, configured to cause the computer system to at least perform the method of claim 1.

15. A metrology device comprising a detector and the computer program product of claim 14.

16. A lithographic apparatus comprising a pattern forming apparatus and the metrology device of claim 15.

17. A method of performing a position measurement on a dual direction alignment mark comprising a first periodic structure having a direction of periodicity along a first direction arranged with a second periodic structure having a direction of periodicity in a second direction different to the first direction, the mark configured to be scanned obliquely to the first direction and second direction, the method comprising:
obtaining signal data relating to the position measurement, the signal data comprising at least a first direction component relating to a first effective pitch detected during the oblique scan and a second direction component of the signal data related to a second effective pitch detected during the oblique scan direction; and
applying a correction for signal disturbance due to vibrations at a difference frequency corresponding to the difference of a first frequency in the signal data relating to the first effective pitch and a second frequency in the signal data relating to the second effective pitch.

18. The method as claimed in claim 17, wherein the applying a correction comprises using additional frequency components in the signal data caused by the signal disturbance at the difference frequency to detect and determine the correction for the signal disturbance.

19. The method as claimed in claim 17, further comprising creating an oblique projection operator which operates on the signal data and blocks the signal disturbance due to vibrations at the difference frequency, while passing model functions describing the signal data at the first frequency and second frequency.

20. The method as claimed in claim 19, wherein the oblique projection operator is further operable to block crosstalk signal impact in the signal data resulting from crosstalk of neighboring structures which neighbor the alignment mark.

* * * * *